United States Patent [19]

Kim

[11] Patent Number: 5,770,474
[45] Date of Patent: Jun. 23, 1998

[54] METHOD OF FABRICATING LASER DIODE

[75] Inventor: Ang-Seo Kim, Ichon, Rep. of Korea

[73] Assignee: Hyundai Electronics Industries Co., Ltd., Ich'on, Rep. of Korea

[21] Appl. No.: 882,179

[22] Filed: Jun. 25, 1997

[30] Foreign Application Priority Data

Jun. 29, 1996 [KR] Rep. of Korea ...................... 96-26310

[51] Int. Cl.$^6$ .................................................. H01L 21/00

[52] U.S. Cl. ................................ 438/31; 438/40; 438/41;
148/DIG. 50; 148/DIG. 95

[58] Field of Search ................................ 438/31, 40, 41;
148/DIG. 50, DIG. 95

[56] References Cited

U.S. PATENT DOCUMENTS

| | | | |
|---|---|---|---|
| 4,994,143 | 2/1991 | Kim | 156/649 |
| 5,021,361 | 6/1991 | Kimoshita et al. | 437/129 |
| 5,541,950 | 7/1996 | Kizuki et al. | 372/46 |

*Primary Examiner*—John Niebling
*Assistant Examiner*—Long Pham
*Attorney, Agent, or Firm*—Ware, Fressola, Van Der Sluys & Adolphson LLP

[57] ABSTRACT

A method of fabricating a laser diode with reverse mesa structure has the following processes. A buffer layer of a first conductivity type, an active layer, a clad layer of a second conductivity type and a high-concentration contact layer of the second conductivity type are sequentially formed on a compound semiconductor substrate of the first conductivity type. Predetermined portions of the contact layer and of the clad layer are etched to form a reverse mesa structure. A passivation layer is formed on the overall substrate and the passivation existing on the reverse mesa structure is removed to expose the contact layer. A metal layer is formed on the exposed contact layer to contact therewith and a conductive metal layer is uniformly formed on the metal layer and the passivation layer. A pad metal layer is formed on the conductive metal layer to fill the etched portions of either side of the reverse mesa structure.

7 Claims, 4 Drawing Sheets

METHOD OF FABRICATING LASER DIODE

BACKGROUND OF THE INVENTION

1. Field of the Invention

The present invention relates to a method of fabricating a semiconductor laser device, more particularly, to a method of fabricating a laser diode with a reverse mesa structure.

2. Description of the Related Art

A laser diode generates laser light from current it receives. The laser diode is generally used as a source of generating optical signals in optical communication systems, and is also used as a light source in instrumentation apparatus, information processing apparatus, and pointers.

Generally, a reverse mesa ridge waveguide laser diode (RM-RWG-LD) has a reverse mesa structure having a shape wherein its sides are sloped and its top is wider than its bottom. The RM-RWG-LD possesses excellent characteristics due to its active layer, of which the width is 1.5 to 2.5 $\mu$m, has a low serial resistance.

FIGS. 1A to 1C show the process of fabricating a conventional RM-RWG-LD.

Referring to FIG. 1A, a n-InP buffer layer 2 and an u-InGaAsP active layer 3 are sequentially formed on a n-InP substrate 1. A p-InP clad layer 4 is then formed on the u-InGaAsP active layer 3, and a $p^+$-InGaAs contact layer 5 is formed on the p-InP clad layer 4. A predetermined mask pattern (not shown) is formed on the $p^+$-InGaAs contact layer 5 by a well-known method. Predetermined portions of $p^+$-InGaAs contact layer 5 and of the p-InP clad layer 4 are etched by wet etching using the mask pattern resulting in a reverse mesa structure as shown in this figure. The mask pattern is then removed by a well-known method.

Referring to FIG. 1B, a passivation layer 6 is uniformly formed on the structure of FIG. 1A and a polyimide layer 7 is then formed to fill the etched portions of either side of the reverse mesa structure. A predetermined portion of the passivation layer 6 that exists on the reverse mesa structure, is removed to expose a predetermined portion of $p^+$-InGaAs contact layer 5, as shown.

Referring to FIG. 1C, a pattern of ohmic contact metal layer 8 is formed by a well-known method on the exposed portion of $p^+$-InGaAs contact layer 5 and overlapping sections of the passivation layer 6 and of the polyimide layer 7. A conductive metal layer 9 is then formed on the overall substrate, and a pad metal layer 10 is thickly formed thereon by gold-plating. Afterwards, the substrate is cut into individual elements (not shown).

In the process of fabricating the reverse mesa structure, however, the polyimide layer 7 which fills the etched portions has poor adhesion quality because it gradually becomes volatile with a rise in temperature wherein its volume decreases due to the evaporation of its liquid component. Therefore, the conductive metal layer 9 and the pad metal layer 10 are apt to be separated from the polyimide layer 7, and the polyimide layer 7 also is apt to be separated from the passivation layer 6. Furthermore, when the substrate is cut into individual elements for forming a laser diode, the polyimide layer 7 is roughly and unevenly cut due to its material properties. Accordingly, a portion of pad metal layer 10 may separate from the underlying layers and fall into a facet from which is emitted, thereby deteriorating the characteristics and reliability of the laser diode.

SUMMARY OF THE INVENTION

Accordingly, an object of the present invention is to provide a method of fabricating a laser diode, without the use of a polyimide layer to prevent a separation of the metal layer, thereby improving the characteristic and reliability of the laser diode.

To achieve the above object, according to the present invention, a laser diode is fabricated by the following processes. A buffer layer of a first conductivity type, an active layer, a clad layer of a second conductivity type and a high-concentration contact layer of the second conductivity type are sequentially formed on a compound semiconductor substrate of the first conductivity type. Predetermined portions of the contact layer and of the clad layer are etched to form a reverse mesa structure. A passivation layer is formed on the overall substrate and the passivation existing on the reverse mesa structure is removed to expose the contact layer. A metal layer is formed on the exposed contact layer to contact therewith and a conductive metal layer is uniformly formed on the metal layer and the passivation layer. A pad metal layer is formed on the conductive metal layer to fill the etched portions of either side of the reverse mesa structure.

In this embodiment, the conductive metal layer is formed by two-step deposition processes in different directions from each other using an electron beam evaporator.

In this embodiment, the conductive metal layer is formed by one step deposition process using thermal evaporator.

BRIEF DESCRIPTION OF THE ATTACHED DRAWINGS

The objects and features of the invention may be better understood with reference to the following detailed description, appended claims, and attached drawings wherein:

FIGS. 1A to 1C are simplified cross-sectional views showing the fabricating process of a conventional laser diode with a reverse mesa structure; and FIGS. 2A to 2G are simplified cross-sectional views showing the fabricating process of a laser diode with a reverse mesa structure according to a preferred embodiment of the present invention.

DETAILED DESCRIPTION OF PREFERRED EMBODIMENT

An embodiment according to the present invention is described below with reference the attached drawings.

FIGS. 2A to 2G are cross-sectional views showing the process of fabricating a laser diode with a reverse mesa structure according to a preferred embodiment of the present invention.

Figure 1A:
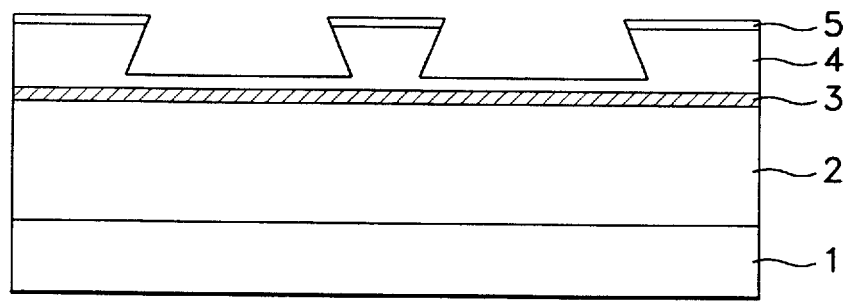
Figure 1B:
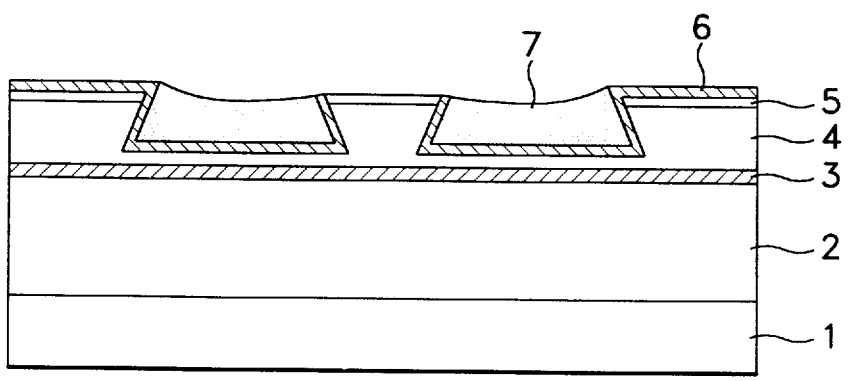
Figure 1C:
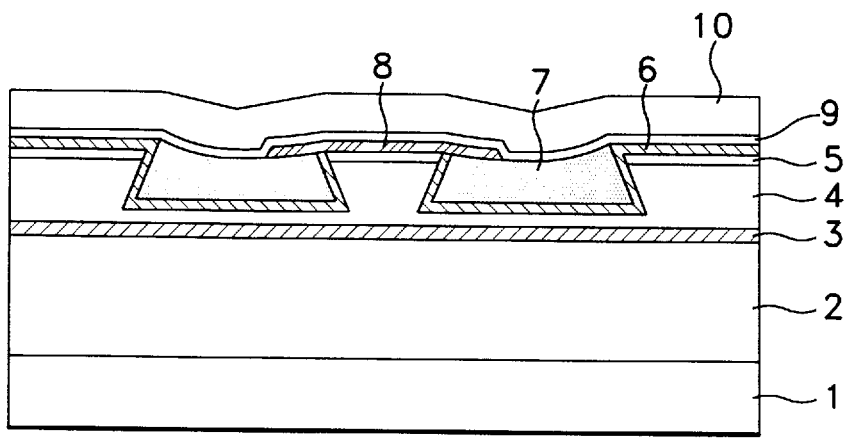
Figure 2A:
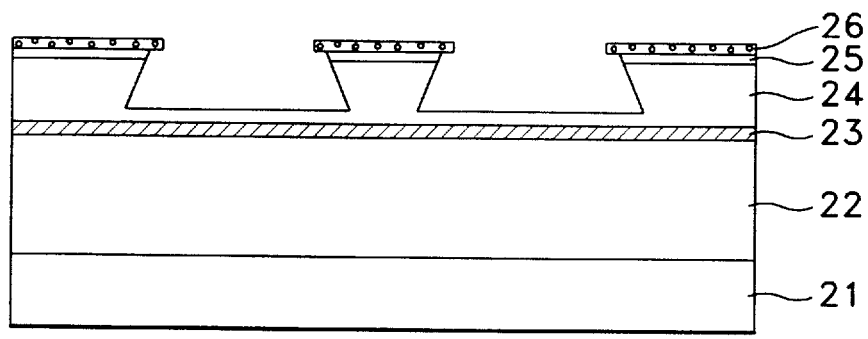

Referring to FIG. 2A, a n-InP buffer layer 22, an u-InGaAsP active layer 23 and a p-InP clad layer 24 are sequentially formed on a n-InP substrate 21 by epitaxial growth such as MOCVD, LPE or MBE. A $p^+$-InGaAs contact layer 25 is formed on the p-InP clad layer 24, and a predetermined mask pattern 26 is formed on $p^+$-InGaAs contact layer 25 by a well-known method. Predetermined portions of the $P^+$-InGaAs contact layer 25 and of p-InP clad layer 24 are etched by wet etching using mask pattern 26, resulting in a reverse mesa structure.

Figure 2B:
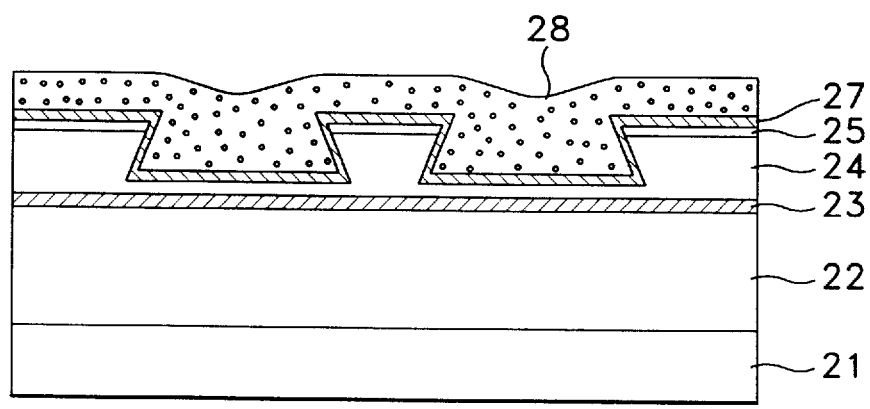

Referring to FIG. 2B, the mask pattern 26 is removed by wet etching using 7:1 BOE solution, and a passivation layer 27 is then uniformly formed on the overall substrate. The passivation layer 27 is formed by depositing a silicon oxide layer or a silicon nitride layer by PECVD. Thereafter a photoresist layer 28 is coated on the passivation layer 27 to fill the etched portions.

Figure 2C:
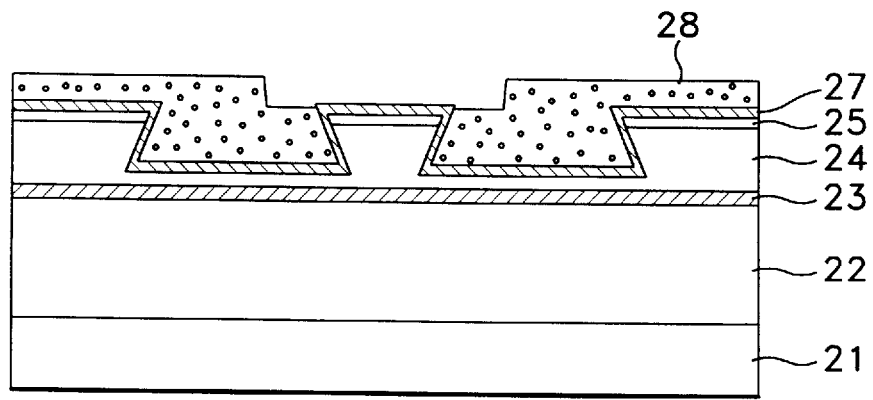

Referring to FIG. 2C, a predetermined portion the photoresist layer 28 is exposed and developed, to expose the passivation layer 27 existing on the reverse mesa structure. In other words, the photoresist layer 28 is exposed at less-than-conventional exposure level, and developed. Ashing is then performed to the developed photoresist layer.

Figure 2D:
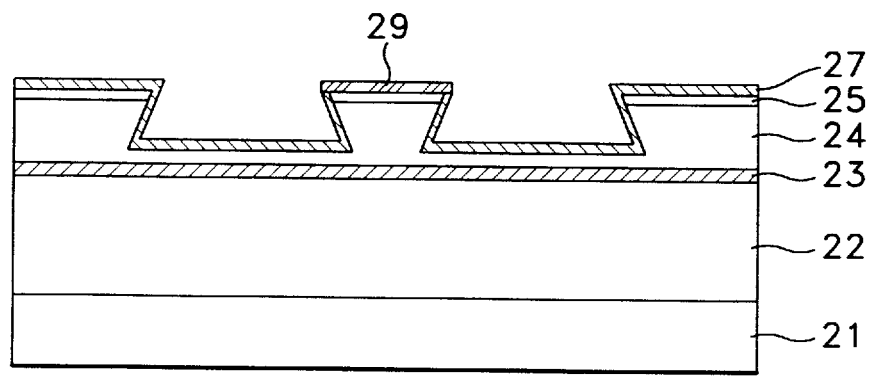

Referring to FIG. 2D, the exposed passivation layer 27 is removed by wet etching using 7:1 BOE solution to expose $p^+$-InGaAs contact layer 25 existing on the reverse mesa structure. An ohmic contact metal pattern 29 is then formed on the exposed $p^+$-InGaAs contact layer 25, to form an ohmic contact. The photoresist layer 28 is then removed by an well-known method.

Thereafter, annealing is carried out, followed by the formation of a conductive metal layer to establish a connection path for the current needed for the following plating process. This conductive metal layer is uniformly deposited on the reverse mesa structure by following method.

Figure 2E:
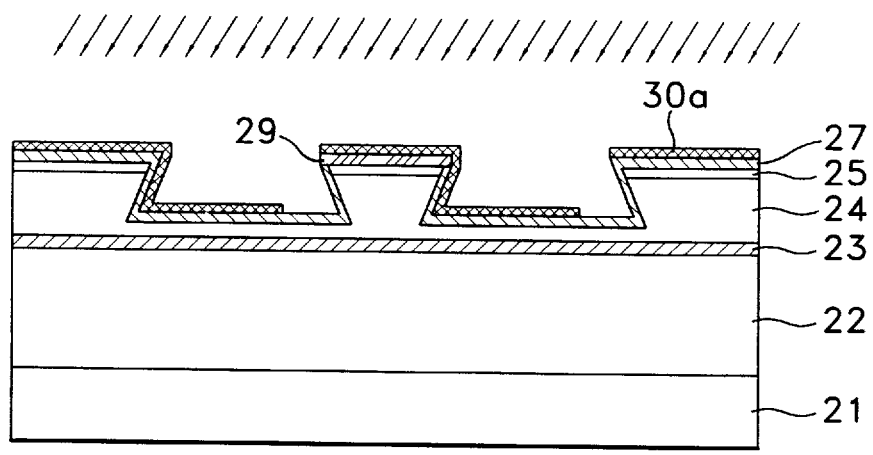
Figure 2F:
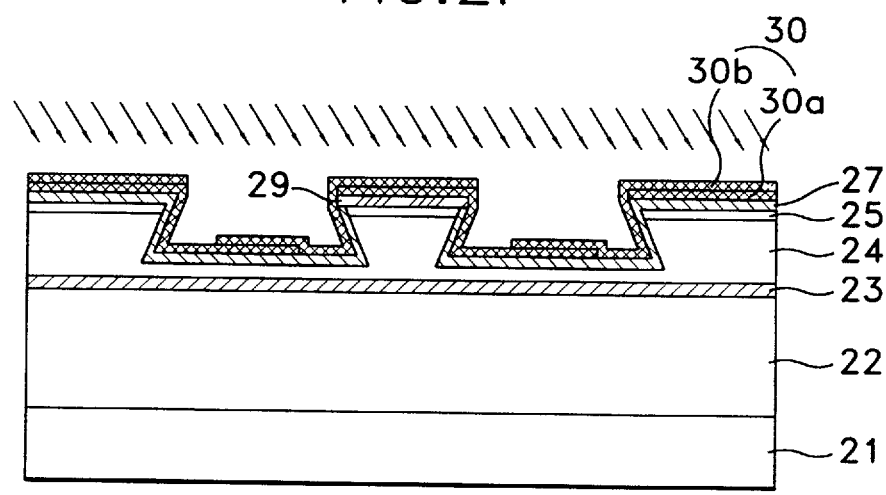

As shown in FIG. 2E, a first conductive metal layer 30a, preferably, a stack layer of a Ti layer and a Au layer, is deposited on the structure of FIG. 2D, using an electron beam evaporator. Here, the deposition direction of the first conductive metal layer 30a is inclined to the right. As shown in FIG. 2F, a second conductive metal 30b, preferably, a stack layer of a Ti layer and a Au layer, is then deposited on the structure of FIG. 2E, using the electron beam evaporator. Here, the deposition direction of the second conductive metal layer 30b is inclined to the left. The first and second conductive metal layers 30a and 30b are connected to each other on the reverse mesa and at the etched portions on either side of the reverse mesa structure. In other words, the first and second conductive metal layers 30a and 30b are deposited in a two step process wherein the direction inclined right in the first step and left in the second step, respectively. Therefore, a conductive metal layer 30 is uniformly formed over and to either side of the reverse mesa as shown in FIG. 2F.

In case a thermal evaporator is used instead of the electron beam evaporator, the conductive metal layer 30 can be formed by a one step deposition process.

Figure 2G:
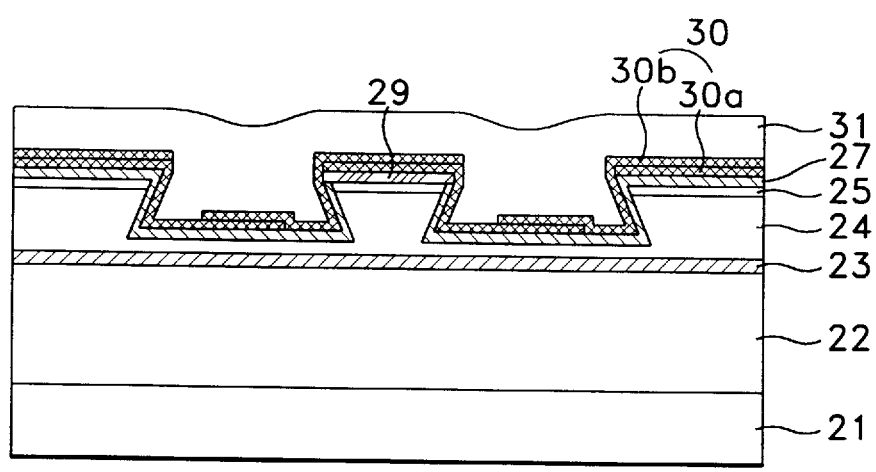

Thereafter, as shown in FIG. 2G, a pad metal layer 31 is formed thickly on the conductive metal layer 30 by gold-plating.

According to the above-described embodiment, in the process of fabricating the laser diode, a polyimide layer is not used. Instead, the conductive metal layer is uniformly formed to the surface of the reverse mesa, and The etched portions of either side of the reverse mesa structure are filled by the pad metal layer. Thus, because there are not the problems of poor adhesion quality due to the use of a polyimide layer, the layers do not become separated, thereby improving the characteristics and reliability of the laser diode.

While this invention has been described with reference to illustrative embodiment, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as falling within the true scope of the invention.

What is claimed is:

1. A method of fabricating a laser diode, comprising the steps of:

sequentially forming a buffer layer of a first conductivity type, an active layer, a clad layer of a second conductivity type and a high-concentration contact layer of the second conductivity type on a compound semiconductor substrate of the first conductivity type;

etching portions of said contact layer and of said clad layer to form a reverse mesa structure;

forming a passivation layer on the overall substrate;

removing said passivation existing on the reverse mesa structure to expose said contact layer;

forming a metal layer on said exposed contact layer to contact therewith;

uniformly forming a conductive metal layer on said metal layer and said passivation layer; and forming a pad metal layer on the conductive metal layer to fill the etched portions of either side of the reverse mesa structure.

2. The method of fabricating a laser diode as claimed in claim 1, wherein said conductive metal layer is formed by two-step deposition processes in different directions from each other using an electron beam evaporator.

3. The method of fabricating a laser diode as claimed in claim 2, wherein said step of forming the conductive metal layer using electron beam evaporator comprises the substeps of:

depositing a first conductive metal layer with the electron beam evaporator inclined in a first direction; and depositing a second conductive metal layer with the electron beam evaporator inclined in a second direction that is opposite to said first direction.

4. The method of fabricating a laser diode as claimed in claim 3, wherein said conductive metal layer is the stack layer of a Ti layer and a Au layer.

5. The method of fabricating a laser diode as claimed in claim 1, wherein said conductive metal layer is formed by one step deposition process using thermal evaporator.

6. The method of fabricating a laser diode as claimed in claim 5, wherein said conductive metal is the stack layer of a Ti layer and a Au layer.

7. The method of fabricating a laser diode as claimed in claim 1, wherein the step of forming said passivation layer comprises the substeps of:

depositing said passivation layer on the overall substrate on which the reverse mesa structure is formed;

coating a photoresist layer on said passivation layer to fill said etched portions of either side of said reverse mesa structure;

exposing and developing said photoresist layer to expose said passivation layer existing on the reverse mesa structure;

removing said exposed passivation layer; and removing said photoresist layer.

\* \* \* \* \*